US005300889A

United States Patent [19]

Bakhoum

[11] Patent Number: 5,300,889

[45] Date of Patent: * Apr. 5, 1994

[54] GROUND-FREE ELECTROSTATIC MEASUREMENT DEVICE WITH ELECTRICAL CHARGE STORING CAPACITOR

[76] Inventor: Ezzat G. Bakhoum, P.O. Box 2818, Durham, N.C. 27715-2818

[ * ] Notice: The portion of the term of this patent subsequent to Jan. 12, 2000 has been disclaimed.

[21] Appl. No.: 105,502

[22] Filed: Aug. 11, 1993

Related U.S. Application Data

[62] Division of Ser. No. 945,299, Sep. 15, 1992, Pat. No. 5,247,420.

[51] Int. Cl.[5] .................... G01R 29/12; G01R 5/28

[52] U.S. Cl. .................... 324/457; 324/109; 324/111

[58] Field of Search .................... 324/72, 72.5, 109, 111, 324/126, 133, 452, 457; 340/561, 562

[56] References Cited

U.S. PATENT DOCUMENTS

| | | | |
|---|---|---|---|
| 3,760,262 | 9/1973 | Chovanec et al. | 324/452 |
| 3,828,250 | 8/1974 | Buser et al. | 324/72 |
| 4,321,546 | 3/1982 | Schneider, Jr. et al. | 324/457 |
| 5,179,497 | 1/1993 | Bakhoum | 361/212 |
| 5,247,420 | 9/1993 | Bakhoum | 361/212 |

*Primary Examiner*—Gerard R. Strecker

[57] ABSTRACT

A ground-free device for measurement of electrostatic potentials on objects. The device is based on the fundamental concept that the static charge on most objects can be estimated by means of a discharge terminal equipped with a capacitor.

8 Claims, 2 Drawing Sheets

GROUND-FREE ELECTROSTATIC MEASUREMENT DEVICE WITH ELECTRICAL CHARGE STORING CAPACITOR

CROSS-REFERENCE TO RELATED APPLICATION

This is a division of U.S. application Ser. No. 07/945,299 filed Sep. 15, 1992 in the name of Ezzat G. Bakhoum for "A Ground-free Static Charge Indicator/Discharger" (now U.S. Pat. No. 5,247,420).

BACKGROUND OF THE INVENTION

1. Field of the Invention

This invention relates to a device for measurement of electrostatic potential on a body, and particularly a device of such type which does not require a ground connection.

2. Description of the Related Art

Electrostatic Field meters have been used for at least 30 years. These meters are available in a variety of shapes, configurations, and range capabilities. The principle of operation also varies widely. The most famous technologies include: electro-mechanical meters, electro-optical meters, radioactive-source meters, and electronic meters.

The electronic field meter is the type most commonly used today, due to its simplicity and low price. The electronic field meter became possible with the advances in semiconductor technology, and particularly with the appearance of the field-effect transistor (FET). The circuit widely used by manufactures of electronic field meters comprises at least one FET, and associated circuitry for generating a voltage proportional to the field intensity at the gate of the FET.

While electronic field meters have been useful for measurement of electrostatic fields in a variety of applications, they generally suffer from one common disadvantage: the field meter must be held at a relatively large distance from the charged object. This is necessary to protect both the instrument and the operator from spark-over which may result from an object charged to a high potential. Further, since the potential on any charged object is not known as a priori, the operator must generally perform guesswork to determine the proper distance at which the field meter should be held.

A further complication occurs when the object under test has an irregular geometry (shape). Generally, if the object under test does not have a large, regularly shaped planar surface, then the reading of most field meters used today is extremely inaccurate. Considerable accuracy may be obtained by utilizing a ground connection to establish a reference potential; however, such ground connection is usually inconvenient to the user.

It is the objective of the present invention to provide a device which will allow the measurement of extremely high voltages on any charged body, without the risk of exposing the operator to such high voltages; mainly by allowing the meter to be mounted directly on the object under test and be observed by the operator from a safe distance.

It is another objective of the present invention to provide a device which will take accurate measurements of electrostatic potentials in a manner that is independent of the geometry of the object under test, without utilizing a ground connection.

Other aspects and features of the invention will be more fully apparent from the ensuing disclosure and appended claims.

SUMMARY OF THE INVENTION

In a broad aspect, the present invention relates to a ground-free device for sensing the presence of electrostatic charges on a body, comprising:

a capacitor comprising first and second terminals;

a conductive body-contact means for establishing electrical contact with the body, and connected to the capacitor at a first terminal thereof;

a voltage indication means mounted across the terminals of the capacitor.

DETAILED DESCRIPTION OF THE INVENTION, AND PREFERRED EMBODIMENTS THEREOF

The present invention is based on the fundamental concept that the static charge on most objects, including the human body, can be estimated by means of a discharge terminal equipped with a capacitor.

In most instances where friction occurs during bodily movements, the potential on the human body is on the order of 20 KV. The potential on a helicopter hovering a few feet above the earth can reach 200 KV.

As such bodies generally have a small capacitance with respect to earth, it is possible to obtain a small amount of discharge by mounting a corona terminal on the body. If such corona terminal is further equipped with a small capacitor having a capacitance C, the discharge of static will give rise to a voltage V on the capacitor, from which the amount of discharge Q can be calculated, as $Q=CV$. The calculated amount of discharge can then be generally correlated to the total charge on the body.

Figure 1:
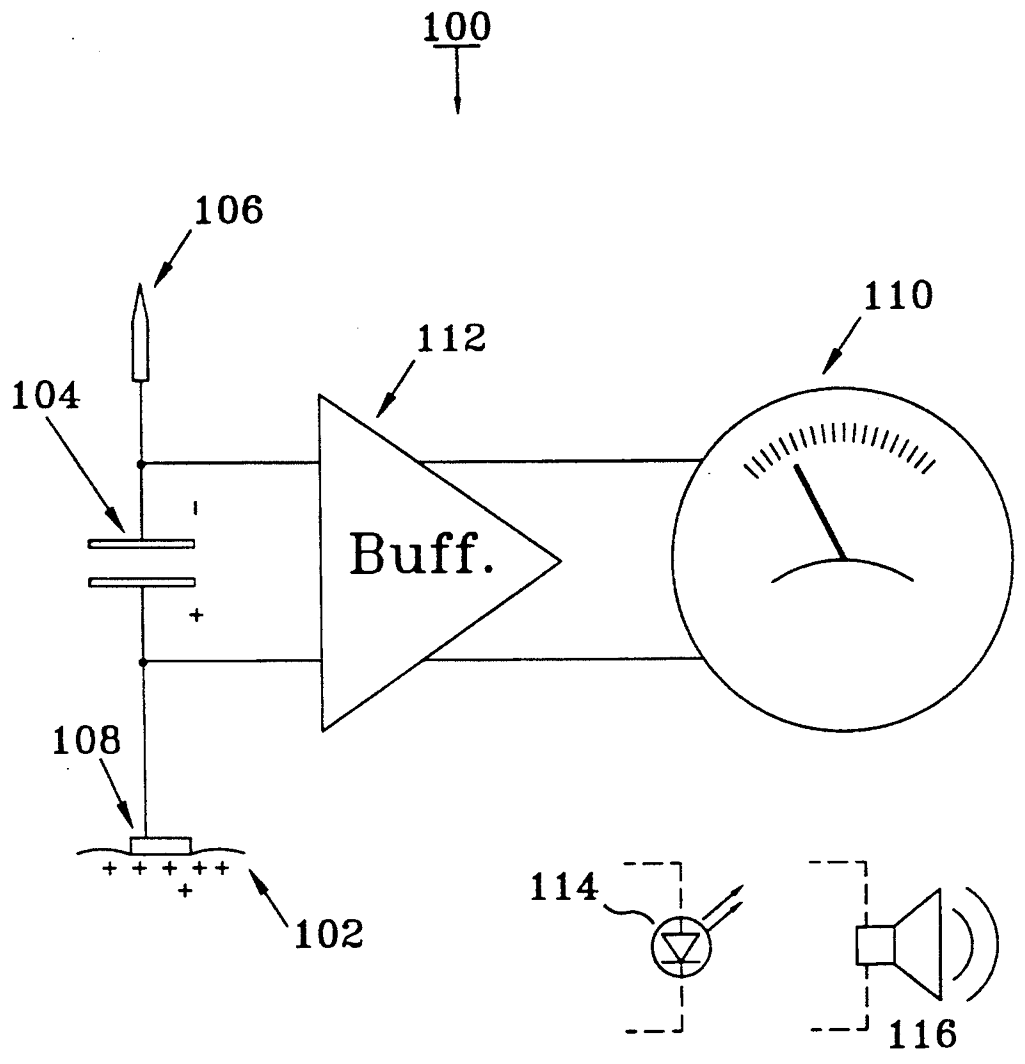
FIG. 1 shows a device for measurement of electrostatic potential on a body according to the present invention.

FIG. 1 illustrates the basic device of the present invention. This figure shows a ground-free device 100 for measurement of electrostatic potential on a body 102. The device comprises a discharge terminal equipped with a capacitor 104 and an optional needle electrode 106. The capacitor 104 is connected to the body via a conductive body-contact means 108. The voltage build-up on the capacitor is measured by a conventional voltmeter 110, featuring high-impedance inputs by means of a buffer 112. By measuring the voltage on the capacitor, the amount of discharge Q can be calculated and correlated to the total charge on body 102 by means of a predetermined table or chart.

Figure 2:
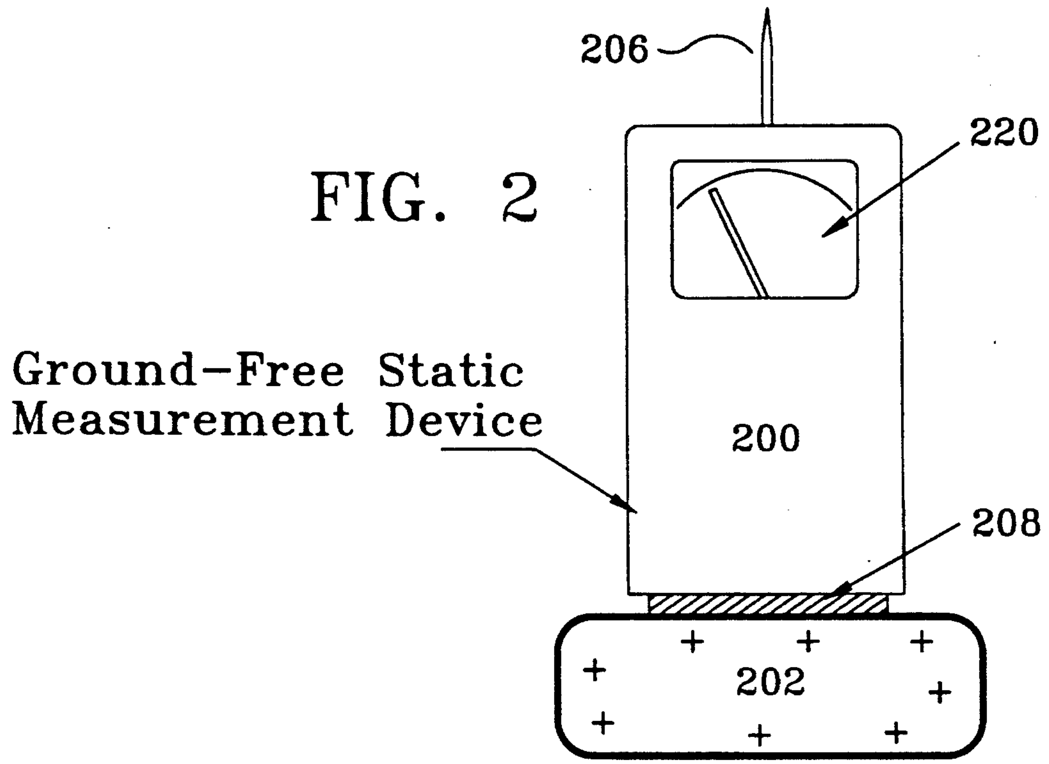
FIG. 2 shows the practical implementation of the device of the present invention as utilized for direct mounting on charged objects.

FIG. 2 shows the practical implementation of the device of the present invention. As shown, the static measurement device 200, which may feature an analog or digital display 220, rests directly on a charged object 202. The device features a body-contact member 208, which may be simply a metallic plate fixed at the bottom of the device, and which is in physical contact with the charged object 202. An optional needle electrode 206 may be mounted on the top of the enclosure of the device 200 and exposed to ambient air, as shown.

Such an application provides a more accurate alternative to conventional electrostatic field meters.

It will be apparent from the foregoing that the static charge measurement device of the present invention is a ground-free device which requires no connections or couplings to earth. Further, it will be recognized that the device of the invention may be compactly configured in any of various conformations so as to be body-mountable in character.

Figure 3:
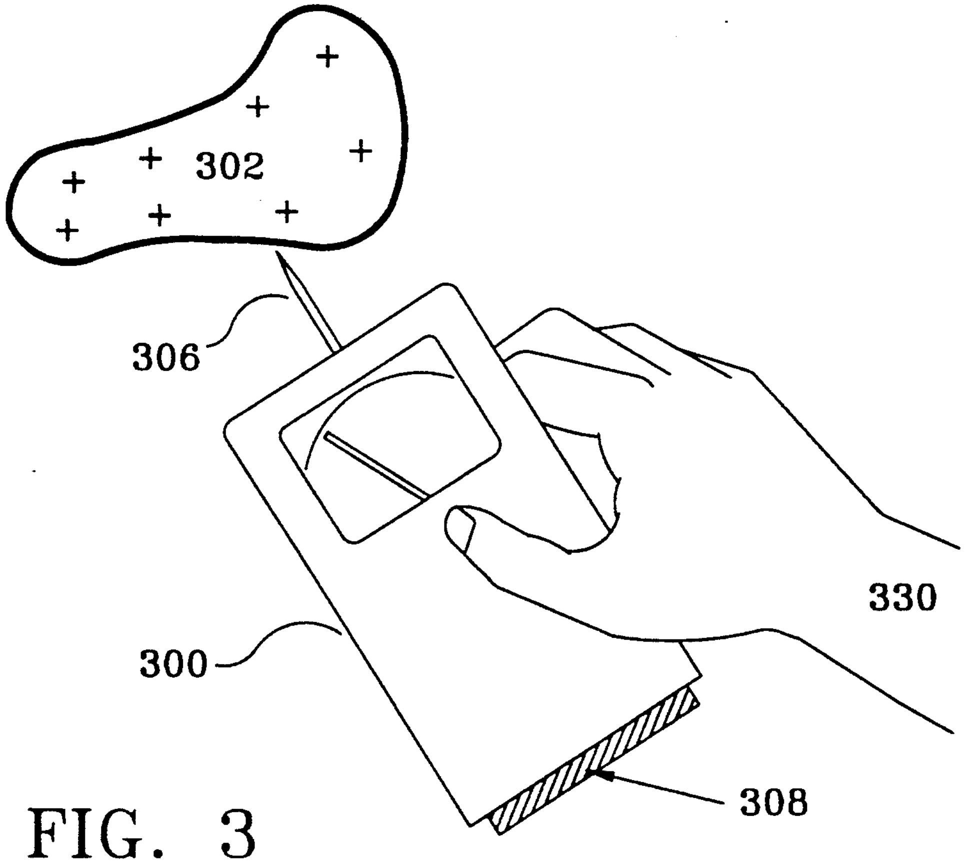
FIG. 3 is a perspective view showing the device of FIG. 2 being used as a hand-held unit.

An optional needle electrode may be connected or placed in close proximity to the discharge terminal of the capacitor to enhance the discharge characteristics, as it is widely known that a needle electrode initiates and maintains a corona discharge effectively. however, such needle electrode is not necessary for proper operation of the device and may be removed without departing from the scope of the invention. Further, it will be apparent to those skilled in the art that such needle electrode, if present, may be used as a body-contact means thus allowing the device to be used as a hand-held unit, without departure from the scope of the invention. FIG. 3 shows the same device of FIG. 2, being used by an operator 330 as a hand-held unit. In this figure, the operator holds the device 300 and brings the needle electrode 306 in contact with a charged object 302. The metallic terminal 308, in this case, is exposed to the air and functions as a free terminal for dissipating charges withdrawn from the body 302.

Finally, while a high-impedance voltmeter has been shown as a voltage indication means in the figure, it will be recognized that other means for indication of voltage can be used in the invention; as for example, light-emitting diodes, audible alarms, threshold circuits, etc. As shown in FIG. 1, a light-emitting diode 114 may be connected to the output terminals instead of voltmeter 110. Alternatively, an audible alarm 116 may be used.

Accordingly, while the invention has been described with reference to specific aspects, features, and embodiments, it will be appreciated that various modifications, alternatives, and other embodiments are possible within the broad scope of the invention, and the invention therefore is intended to encompass all such modifications, alternatives, and other embodiments, within its scope.

What is claimed is:

1. A ground-free device for sensing the presence of electrostatic charges on a body, comprising:

an electrical charge storage capacitor comprising first and second terminals, wherein the second terminal is constructed and arranged for direct exposure to an ambient air environment; and a conductive body-contact means for establishing electrical contact with the body, and connected to the storage capacitor at a first terminal thereof via an electrically conductive path; whereby charge flowing from the body through the conductive body-contact means to the electrical charge storage capacitor is dissipated to air of the ambient air environment at the second terminal of the storage capacitor; and a voltage indication means mounted across the terminals of the storage capacitor.

2. A device according to claim 1, constructed and arranged for measurement of electrostatic charge.

3. A device according to claim 1, constructed and arranged for measurement of electrostatic potential.

4. A device according to claim 1, wherein the voltage-indication means comprises a high-impedance voltmeter.

5. A device according to claim 1, wherein the voltage-indication means comprises a light-emitting diode.

6. A device according to claim 1, wherein the voltage-indication means comprises an audible alarm.

7. A device according to claim 1, constructed and arranged for direct mounting on objects.

8. A device according to claim 1, constructed and arranged for use as a hand-held unit.

* * * * *

UNITED STATES PATENT AND TRADEMARK OFFICE

CERTIFICATE OF CORRECTION

PATENT NO. : 5,300,889

DATED : April 5, 1994

INVENTOR(S) : BAKHOUM

It is certified that error appears in the above-indentified patent and that said Letters Patent is hereby corrected as shown below:

On the title page: [*] Notice should read --. Jan. 20, 2010 --.

Signed and Sealed this

Sixteenth Day of August, 1994

*Attest:*

BRUCE LEHMAN

*Attesting Officer*

*Commissioner of Patents and Trademarks*